United States Patent
Allen et al.

(10) Patent No.: US 12,153,997 B2
(45) Date of Patent: Nov. 26, 2024

(54) APPARATUSES, SYSTEMS, AND METHODS FOR VISIBLE LASER DIODE PREHEAT BIAS CURRENT FOR LOW TEMPERATURE OPERATION

(71) Applicant: Hand Held Products, Inc., Charlotte, NC (US)

(72) Inventors: Christopher Robert Allen, East Windsor, NJ (US); Michael Vincent Miraglia, Hamilton, NJ (US)

(73) Assignee: Hand Held Products, Inc, Charlotte, NC (US)

( * ) Notice: Subject to any disclaimer, the term of this patent is extended or adjusted under 35 U.S.C. 154(b) by 26 days.

(21) Appl. No.: 17/860,409

(22) Filed: Jul. 8, 2022

(65) Prior Publication Data

US 2024/0013017 A1 Jan. 11, 2024

(51) Int. Cl.
*G06K 7/14* (2006.01)
*G05D 23/19* (2006.01)
*G06K 7/10* (2006.01)
*H01S 5/024* (2006.01)

(52) U.S. Cl.
CPC ....... *G06K 7/1417* (2013.01); *G05D 23/1951* (2013.01); *G06K 7/10564* (2013.01); *G06K 7/10881* (2013.01); *G06K 7/1413* (2013.01); *H01S 5/02453* (2013.01); *G06K 2007/10524* (2013.01)

(58) Field of Classification Search
CPC ............. G06K 7/1417; G06K 7/10564; G06K 7/10881; G06K 7/1413; G06K 2007/10524; G06K 7/10732; G05D 23/1951; H01S 5/02453; H01S 5/0617; H01S 5/06835; H01S 5/06804; G11B 7/126
See application file for complete search history.

(56) References Cited

U.S. PATENT DOCUMENTS

| | | | |
|---|---|---|---|
| 4,737,798 A | 4/1988 | Lonis et al. | |
| 5,266,973 A | 11/1993 | Sanger | |
| 7,570,679 B2 | 8/2009 | Gibson et al. | |
| 10,809,643 B2 | 10/2020 | Yuasa et al. | |
| 2004/0104213 A1 | 6/2004 | Lano et al. | |
| 2006/0000911 A1* | 1/2006 | Stekel | G06K 7/10722 235/462.32 |
| 2006/0203862 A1 | 9/2006 | Bonen et al. | |
| 2012/0248190 A1 | 10/2012 | Ogawa et al. | |
| 2021/0391686 A1* | 12/2021 | Klennert | H01S 5/02453 |
| 2023/0111084 A1 | 4/2023 | Blasczak et al. | |

FOREIGN PATENT DOCUMENTS

WO 2008/143612 A1 11/2008

OTHER PUBLICATIONS

Extended European Search Report Mailed on Dec. 7, 2023 for EP Application No. 23177212, 7 page(s).

* cited by examiner

Primary Examiner — Matthew Mikels
(74) Attorney, Agent, or Firm — ALSTON & BIRD LLP

(57) ABSTRACT

Apparatuses, systems, and methods for providing an indicia aimer laser with a preheat bias current for low temperature operation. For example, an indicia reader utilizing a visible laser diode may operate in an environment with temperatures lower than the operational temperature range of the visible light diode. The indicia reader may utilize a preheat current to raise the temperature of the visible light diode into the operational temperature range.

8 Claims, 6 Drawing Sheets

APPARATUSES, SYSTEMS, AND METHODS FOR VISIBLE LASER DIODE PREHEAT BIAS CURRENT FOR LOW TEMPERATURE OPERATION

FIELD OF THE INVENTION

Example embodiments of the present disclosure relate generally to indicia readers and, more particularly, to apparatuses, systems, and methods for aimer lasers of a visible laser diode to receive a preheat bias current for low temperature operation.

BACKGROUND

An indicia reader (e.g., a barcode scanner) is an electronic device that may capture and decode information stored in an indicia (e.g., a barcode). Indicia readers have multiple form factors and are used in varied settings and environments. Environments may require that indicia readers operate in cold temperatures where the ambient temperature is lower than operational temperature range of one or more of the components of the indicia reader, such as a visible laser diode used in an aimer laser of the indicia reader. When such components are not in their operational temperature range then the component does not reliably perform its operation and has increased risk of damage to the components. Applicant has identified many technical challenges and difficulties associated with indicia readers, as well as associated apparatuses, systems, and methods related to addressing these technical challenges and difficulties.

BRIEF SUMMARY

Various embodiments described herein relate to apparatuses, systems, and method for visible laser diode preheat bias current for low temperature operation.

In accordance with various embodiments of the present disclosure, an example indicia reader comprises an aimer laser, a temperature monitor configured to determine a temperature of the aimer laser, and a power source coupled to the aimer laser. In some embodiments, in an instance where the temperature monitor determines the temperature of the aimer laser to be below a first temperature threshold, the power source is configured to apply a preheat current to the aimer laser.

In some embodiments, the preheat current is below a lasing threshold of the aimer laser.

In some embodiments, the preheat current is applied to the aimer laser until the temperature monitor determines temperature of the aimer laser is above the first temperature threshold.

In some embodiments, the preheat current is applied to the aimer laser for a first time period. In some embodiments, the preheat current is continuously applied after the end of the first time period.

In some embodiments, the preheat current is applied to the aimer laser until the temperature monitor determines temperature of the aimer laser is above a second temperature threshold, wherein the second temperature threshold is above the first temperature threshold.

In some embodiments, the aimer laser comprises a visible laser diode.

In some embodiments, the indicia reader further comprises a motion sensor, and wherein the temperature sensor is further configured to determine a temperature of the aimer laser on first determining motion. In some embodiments, the determination of motion comprises motion of the indicia reader. In some embodiments, the determination of motion comprises motion of an indicia.

In accordance with various embodiments, a method for reading indicia comprises measuring a temperature of an aimer laser of an indicia reader; applying, in an instance where the temperature of the aimer laser is below a first threshold, a preheat current to the aimer laser; lasing an indicia with the aimer laser; capturing indicia information from an indicia via the indicia reader; and decoding the captured indicia information.

In some embodiments, measuring the temperature of the aimer laser includes measuring the temperature for rising above a second threshold; and applying the preheat current includes applying the preheat current until the temperature is above the second threshold.

In some embodiments, applying the preheat current is for a first time period.

In some embodiments, applying the preheat current continues after the end of the first time period.

In some embodiments, applying the preheat current to the aimer laser includes applying the preheat current until the temperature exceeds a second threshold, and the second temperature threshold is above the first temperature threshold.

In some embodiments, the method further comprises determining, prior to applying the preheat current, motion with a motion sensor of the indicia reader. In some embodiments, determining motion includes determining motion of the indicia reader. In some embodiments, determining motion includes determining motion of an indicia The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Figure 1:
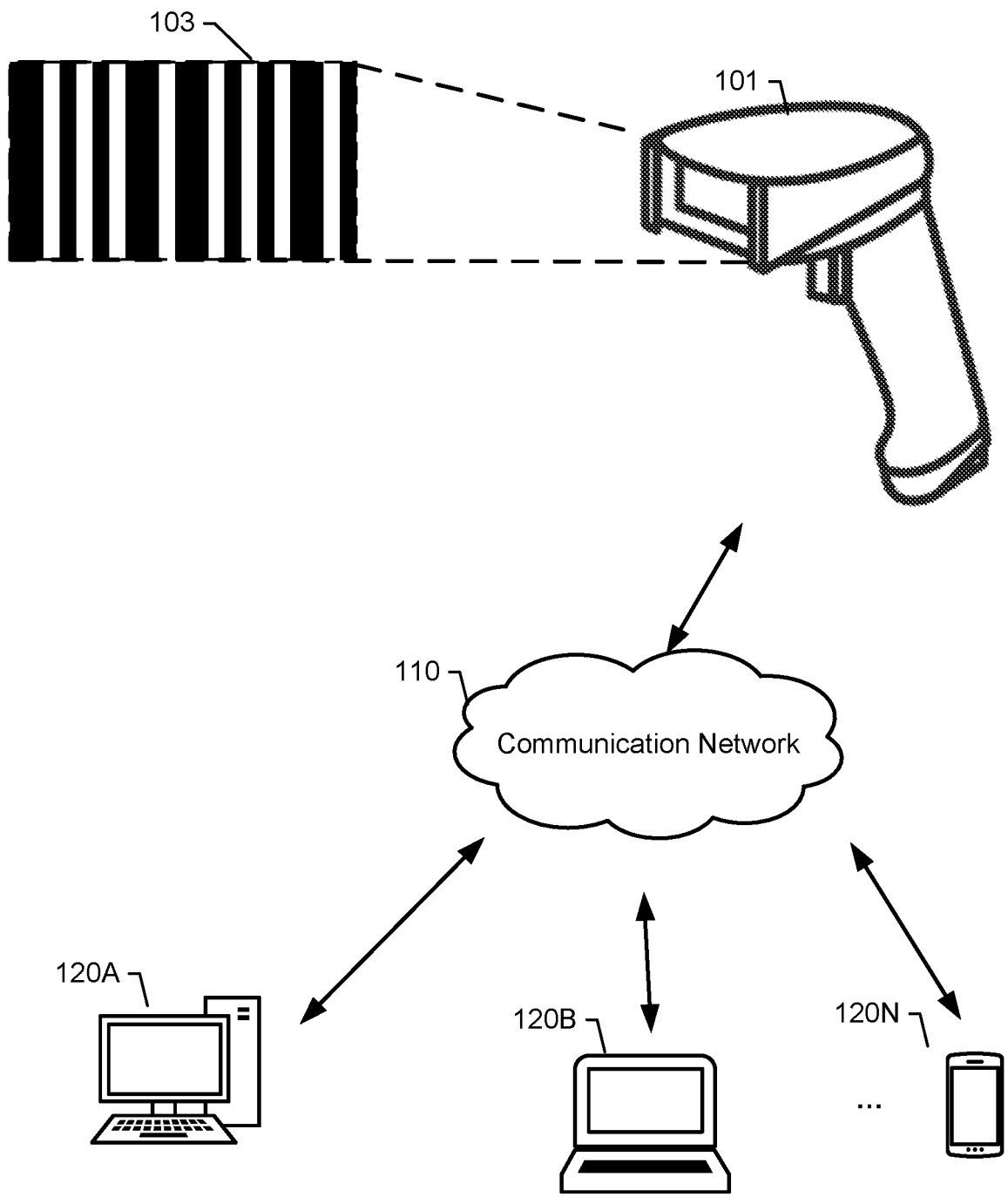
FIG. 1 is an example system diagram illustrating an exemplary system associated with an example indicia reader in accordance with some embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in some embodiments," "according to one embodiment," "in one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

The use of the term "circuitry" as used herein with respect to components of an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, storage media, network interfaces, input/output devices, and the like. In some embodiments, other elements may provide or supplement the functionality of particular circuitry.

The term "electronically coupled," "electronically coupling," "electronically couple," "in communication with," "in electronic communication with," or "connected" in the present disclosure refers to two or more elements, modules, or components being connected through wired means and/or wireless means, such that signals, electrical voltage/current, data and/or information may be transmitted to and/or received from these elements or components.

In the present disclosure, the term "indicia" refers to one or more machine-readable/machine-decodable codes that represent data and information in a visual form that may include, but not limited to, patterns, lines, numbers, letters, and/or the like. Examples of indicia may include, but are not limited to, one-dimensional (1D) barcodes, two-dimensional (2D) barcodes, Quick Response (QR) codes, information-based indicia, Aztec codes, data matrix, texts, and/or the like. In some embodiments, indicia may be affixed, printed, or otherwise attached to items and/or objects to provide information regarding the item or the object in a machine-readable/machine-decodable format.

In the present invention described herein, improvements to indicia readers are described to provide for operation of indicia readers in low temperature environments. In some embodiments, indicia readers may include an aimer to assist a user with determining where the indicia reader is aimed. This allows a user to know where to place and aim the indicia reader with respect to an indicia. In some embodiments, the aimer may use a visible light diode to create a green or red light that a user may aim to assist with the capturing of indicia by the indicia reader. In some embodiments, a green laser may provide a benefit in being easier to see by the human eye. Some embodiments may include long range applications where the aimer may be emitted at an indicia that is 80 or more feet away from the indicia reader. For example, a warehouse may include a long range application where an indicia reader is reading indicia 80 feet away from the user of the indicia reader. In all applications, there is a need to be able to accurately aim the indicia reader with the aimer.

The environments an indicia reader are required to operate in include many cold environments that have ambient temperatures below the operational temperature ranges of one or more components of the indicia reader. For example, an aimer may include a visible light diode, and the visible light diode to produce a green laser beam. The visible light diode may have an operational temperature range with a lower limit of −10 C, but this lower limit may be higher than the ambient of the environment, which may be at −30 C. These environments include natural environments as well as man-made environments, such as cold storage or warehouses. Such cold temperatures exceed to the low temperature operational limits of lasers used in the aimers of indicia readers, which may cause operation of the component to be unstable if it functions at all. To the extent the component may function, its instability may cause unintended consequences (e.g., excessive power draw). As these visible light diodes may not be linear devices, operating the laser outside of the operational temperature ranges may cause the laser to operate in an unexpected manner by emitting an unexpected amount of light or not emitting any light at all. Additionally, operating a visible laser diode outside of its operational temperature range may damage, or increase the risk of damaging, the visible light diode as well as shorten the life of the laser.

To address low temperature environment some indicia readers may utilize heaters internal to the indicia reader but external to the aimer or to the aimer component, such as the visible light diode. These external heaters add bulk and circuitry to the indicia reader. They may also consume unacceptably large amounts power for the indicia reader in order to power resistive elements to generate heat. Such unacceptably large use of power becomes an even greater issue when an indicia reader may use a battery as a power source.

Embodiments described herein provide improvements to address such challenges and difficulties by preheating the aimer laser, including preheating the visible light diode. The preheating may occur with a preheat current applied to the visible light diode, which generates heat in the aimer laser to bring it into an operational temperature range in order for the aimer laser to be in stable operation.

In some embodiments, preheating of the aimer laser may be by raising a junction temperature above a threshold. The threshold may be set by an aimer laser's operational temperature range. In some embodiments, this operational temperature range is above the ambient temperature. For example, if an ambient temperature is −30 C and the aimer laser's operational temperature range has a lower threshold of −10 C, then some embodiments of the present invention may preheat the aimer laser to at least −10 C before operating the aimer laser. In some embodiments, the preheating may be to a threshold temperature that is greater than the lower operational temperature range threshold of, in this example, −10 C, in order to provide a temperature buffer. Such a temperature buffer may allow the indicia reader to be exposed to the environment when the preheat current is not being applied without the visible light diode dropping below the lower end of the operational temperature range.

In some embodiments, the preheat current may be run through the aimer laser may be a lower amount of current than is needed to cause the aimer laser to emit light or lase (e.g., to emit light at a sufficient level to serve as an aimer). The amount of current needed to cause the aimer to lase may be referred to as a lasing threshold. In some embodiments, the preheat current may cause the aimer laser to emit some small amount of light, but it may be dim or may be undetectable by a user. In some embodiments, visible laser diodes are not linear. For example, as more current is applied to the visible laser diode, the brightness of the light emitted does not increases linearly. Additionally, there is a minimum current threshold to begin emitting light, and until a current is applied above that minimum threshold then there is no light or almost no light emitted. In some embodiments, the preheat current is below this minimum threshold In some embodiments a temperature monitor may be utilized to determine the temperature of the aimer laser. The temperature monitor may determine the temperature of the visible laser diode or of an area near the visible laser diode, including but not limited to a portion of a printed circuit board the visible laser diode is mounted on. The preheat current may be applied to the aimer laser until the temperature monitored rises above a threshold. Alternatively, the preheat current may be applied for a period of time, which may be known or to have been determined to raise the temperature of an aimer laser to be within the operational temperature range.

FIG. 1 is an example system diagram illustrating an example indicia reader in accordance with some embodiments of the present disclosure. In the example shown in FIG. 1, the indicia reader 101 may read indicia 103 and also may be in electronic communication with one or more connected device 120A, 120B, . . . 120N via a communication network 110.

For example, the indicia reader 101 may capture and decode indicia imaging data associated with the indicia 103. While the indicia 103 in the example shown in FIG. 1 comprises a barcode, the scope of the present discourse is not limited to the example shown in FIG. 1. As described above, an example indicia in accordance with embodiments of the present disclosure may include additional types of indicia described herein.

The indicia reader 101 may be portable or may be fixed. The form factor of the indicia reader 101 may change depending on if it is portable or fixed. A fixed indicia reader 101 may be permanently or temporarily affixed to a location. A fixed indicia reader 101 may allow for a user to remotely utilize the indicia reader 101 to capture and decode indicia 103.

In some embodiments, a user may utilize the indicia reader 101 to capture indicia imaging data associated with the indicia 103. For example, a user may trigger the indicia reader 101 by pointing the indicia reader 101 to the indicia 103 and pulling a trigger of the indicia reader 101. Alternatively, or additionally, in some embodiments an indicia reader 103 may include a motion sensor, which may be used to trigger the indicia reader to capture indicia imaging data. In some embodiments, the indicia reader 101 may comprise an imaging component that comprises one or more imaging optics and an imaging sensor. The imaging sensor may capture an image of the indicia 103, and may generate indicia imaging data corresponding to the indicia 103. In some embodiments, the indicia reader 101 may comprise an illumination component that may illuminate a field of view so as to improve the imaging quality of the indicia imaging data.

In some embodiments, the indicia reader 101 may communicate data and/or information (such as, but not limited to, indicia imaging data or indicia information) to the one or more connected devices. In some embodiments, the communication network 110 may include any wired or wireless communication network including, for example, a wired or wireless local area network (LAN), personal area network (PAN), metropolitan area network (MAN), wide area network (WAN), or the like, as well as any hardware, software and/or firmware required to implement it (such as, e.g., network routers, etc.). For example, the communication network 110 may include an 802.11, 802.16, 802.20, and/or WiMax network. Further, the communication network 110 may include a public network (such as the Internet), a private network (such as an intranet), or combinations thereof, and may utilize a variety of networking protocols including, but not limited to, TCP/IP based networking protocols. For instance, the networking protocol may be customized to suit the needs of the indicia reader 101. In some embodiments, the protocol is a custom protocol of JSON objects sent via a WebSocket channel. In some embodiments, the protocol is JSON over RPC, JSON over REST/HTTP, and the like.

While the description above provides some examples of the communication network that can facilitate data communications between the indicia reader 101 and the connected devices 120A, 120B, . . . , 120N, it is noted that the scope of the present disclosure is not limited to the description above. In some embodiments, the indicia reader 101 may communicate with the connected devices 120A, 120B, . . . , 120N through other means. For example, the indicia reader 101 may communicate with the connected devices 120A, 120B, . . . , 120N through communication protocols such as, but not limited to, general packet radio service (GPRS), Universal Mobile Telecommunications System (UMTS), Code Division Multiple Access 1900 (CDMA1900), CDMA1900 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), Institute of Electrical and Electronics Engineers (IEEE) 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol. The indicia reader 101 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

In some embodiments, the indicia reader 101 may generate one or more decoded data strings based on the indicia imaging data, and may transmit the one or more decoded data strings to the one or more connected devices 120A, 120B, . . . , 120N. Additionally, or alternatively, the one or more connected devices may receive indicia imaging data from the indicia reader 101 and may process the indicia imaging data to generate one or more decoded data strings that correspond to the indicia 103.

Figure 2:
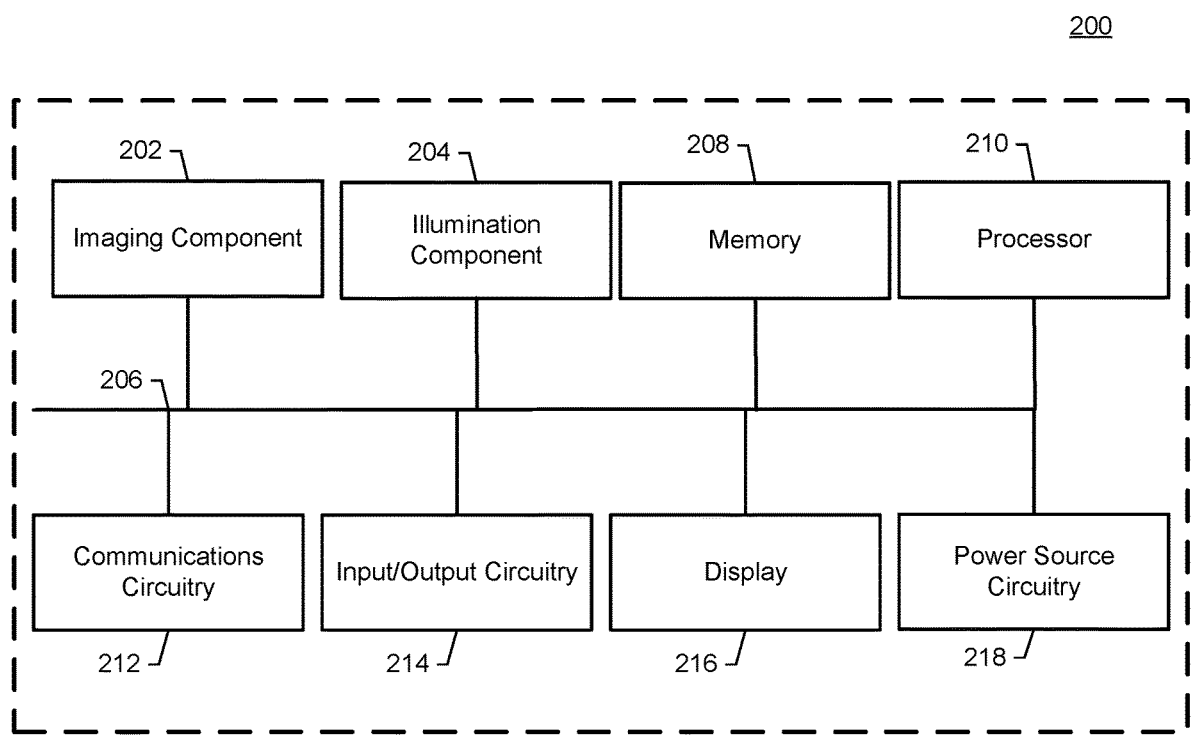
FIG. 2 illustrates an example block diagram of an example indicia reader in accordance with example embodiments described herein.

FIG. 2 illustrates an example block diagram of an example indicia reader 101 in accordance with example embodiments described herein. For example, the indicia reader 101 may comprise apparatus 200 shown in FIG. 2 and may include one or more components, modules, or circuitries that are in electronic commutations with one another. The apparatus 200 may include an imaging component 202, an illumination component 204, a memory 208, a processor 210, a communications circuitry 212, input/output circuitry 214, display 216, and a power source circuitry 218 that are in electronic communication with one another via a system bus 206. In some embodiments, the system bus 206 refers to a computer bus that connects these components so as to enable data transfer and communications between these components. In some embodiments, some or all of these components or modules may be included an engine housed within the indicia reader 101. In some embodiments, an engine may be modular and may allow for replacement of the engine within an indicia reader 101 by another engine in order to provide an indicia reader 101 with different capabilities according to the engine's configuration.

In some embodiments, the imaging component 202 may comprise one or more imaging sensors including, but are not limited to, a color or monochrome 1D or 2D Charge Coupled Device (CCD), Complementary Metal-Oxide-Semiconductor (CMOS), N-channel Metal-Oxide-Semiconductor (NMOS), P-channel Metal-Oxide-Semiconductor (PMOS), Charge Injection Device (CID) or Charge Modulation Device (CMD) solid state image sensor, and/or the like. In some embodiments, the imaging component 202 may include one or more imaging optics that define a field of view for capturing an image of indicia and generating indicia imaging data.

In some embodiments, the illumination component 204 may include one or more illumination sources and one or more illuminating optics assemblies configured to illuminate the field(s) of view of the imaging component 202, so as to improve the quality of the captured indicia imaging data. In some embodiments, the illumination component 204 may include one or more aimers that provide illumination (e.g., an aimer laser or an array of lasers) to indicate where an indica reader 101 is aimed. The aimer may be, for example, a visible light diode (VLD), which may be a green laser or a red laser. Examples of illuminating optics assemblies may include, but are not limited to, one or more lenses, diffusers, wedges, reflectors, or a combination of such elements, for directing light from illumination source in the direction of the field of view. For example, if the image of the indicia 103 shown in FIG. 1 is to be captured, the illuminating optics assembly may be configured to direct light from an illumination source and/or an aimer on to the indicia 103. Some examples of the illumination source may include, but are not limited to, laser diodes (e.g., violet laser diodes, visible laser diodes, edge-emitting laser diodes, surface-emitting laser diodes, and/or the like). Additionally, or alternatively, the illumination source may comprise one or more light-emitting diodes (LEDs). Additionally, or alternatively, the illumination source may comprise one or more other forms of natural and/or artificial sources of light.

In some embodiments, the imaging component 202 and/or the illumination component 204, among other things, may be controlled by the processor 210. For example, the processor 210 may transmit electronic instructions to the illumination component 204 via the system bus 206 to cause the illumination components 204 to execute an operation, including but not limited to triggering the illumination component 204 to illuminate the field of view of the imaging component 202, transmitting electronic instructions to the imaging component 202 to trigger the imaging component 202 to capture indicia imaging data that include one or more images of the indicia, and receiving the indicia imaging data from the imaging component 202.

The processor 210 may be embodied in a number of different ways and may, for example, include one or more processing devices configured to perform independently. Additionally, or alternatively, the processor 210 may include one or more processors configured in tandem via a bus to enable independent execution of instructions, pipelining, and/or multithreading. Additionally, in some embodiments, the processor 210 may include one or processors, some which may be referred to as sub-processors, to control one or more components, modules, or circuitry of the indicia reader 101. The use of the term "processing circuitry" may be understood to include a single core processor, a multi-core processor, and/or multiple processors internal to the apparatus.

For example, the processor 210 may be embodied as one or more complex programmable logic devices (CPLDs), microprocessors, multi-core processors, co-processing entities, application-specific instruction-set processors (ASIPs), and/or controllers. Further, the processor 210 may be embodied as one or more other processing devices or circuitry. The term circuitry may refer to an entirely hardware embodiment or a combination of hardware and computer program products. Thus, the processor 210 may be embodied as integrated circuits, application specific integrated circuits (ASICs), field programmable gate arrays (FPGAs), programmable logic arrays (PLAs), hardware accelerators, another circuitry, and/or the like. As will therefore be understood, the processor 210 may be configured for a particular use or configured to execute instructions stored in volatile or non-volatile media or otherwise accessible to the processor 210. As such, whether configured by hardware or computer program products, or by a combination thereof, the processor 210 may be capable of performing steps or operations according to embodiments of the present disclosure when configured accordingly.

In an example embodiment, the processor 210 may be configured to execute instructions stored in the memory 208 or otherwise accessible to the processor. Alternatively, or additionally, the processor 210 may be configured to execute hard-coded functionality. As such, whether configured by hardware or software methods, or by a combination thereof, the processor may represent an entity (e.g., physically embodied in circuitry) capable of performing operations according to an embodiment of the present disclosure while configured accordingly. Alternatively, as another example, when the processor 210 is embodied as an executor of software instructions, the instructions may specifically configure the processor to perform the algorithms and/or operations described herein when the instructions are executed.

In some embodiments, the memory 208 may be non-transitory and may include, for example, one or more volatile and/or non-volatile memories. In other words, for example, the memory 208 may be an electronic storage device (e.g., a computer readable storage medium). The memory 208 may be configured to store information, data, content, applications, instructions, or the like, for enabling the apparatus 200 to carry out various functions in accordance with example embodiments of the present disclosure. In this regard, the memory 208 may be preconfigured to include computer-coded instructions (e.g., computer program code), and/or dynamically be configured to store such computer-coded instructions for execution by the processor 210.

In an example embodiment, the apparatus 200 further includes a communications circuitry 212 that may enable the apparatus 200 to transmit data and/or information to other devices through a communication network (such as, but not limited to, the connected devices 120A, 120B, ..., 120N as shown in FIG. 1). The communications circuitry 212 may be any means such as a device or circuitry embodied in either hardware or a combination of hardware and software that is configured to receive and/or transmit data from/to a network and/or any other device, circuitry, or module in communication with the apparatus 200. In this regard, the communications circuitry 212 may include, for example, a network interface for enabling communications with a wired or wireless communication network. For example, the communications circuitry 212 may include one or more circuitries, network interface cards, antennae, buses, switches, routers, modems, and supporting hardware and/or software, or any other device suitable for enabling communications via a network. Additionally, or alternatively, the communication interface may include the circuitry for interacting with the antenna(s) to cause transmission of signals via the antenna(s) or to handle receipt of signals received via the antenna(s).

In some embodiments, the apparatus 200 may include the input/output circuitry 214 that may, in turn, be in communication with the processor 210 to provide output to the user and, in some embodiments, to receive an indication of a user input. The input/output circuitry 214 may comprise an interface, a mobile application, a kiosk, or the like. In some embodiments, the input/output circuitry 214 may also include a keyboard, a mouse, a joystick, a touch screen, touch areas, soft keys, a microphone, a speaker, or other input/output mechanisms. The processor and/or user interface circuitry comprising the processor may be configured to control one or more functions of one or more user interface elements through computer program instructions (e.g., software and/or firmware) stored on a memory accessible to the processor (e.g., memory 208). In some embodiments, the input/output circuitry 214 may include a trigger or button that may allow for a user to instruct the indicia reader 101 to capture an image of indicia 103. Additionally, some embodiments may include input/output circuitry 214 such that a user may instruct the indicia reader 101 to select one of multiple imaging optics to utilize, to select one or configure one of multiple illumination components 204 to utilize, and/or to transmit data and/or information to a connected device.

In some embodiments, the apparatus 200 may include the display 216 that may, in turn, be in communication with the processor 210 to display user interfaces (such as, but not limited to, display of indicia or decoded indicia). In various examples of the present disclosure, the display 216 may include a liquid crystal display (LCD), a light-emitting diode (LED) display, a plasma (PDP) display, a quantum dot (QLED) display, and/or the like.

In some embodiments, the apparatus 200 may include power source circuitry 218. In various examples, the power source circuitry 218 may include one or more inter power sources (e.g., batteries) and/or connections to one or more external power sources. The power source circuitry 218 may further include circuitry that connects and controls the distribution of power from these internal and/or external power sources to one or more other components, modules, and/or circuitries of the indicia reader 101 described herein.

Some examples of the apparatus 200 may include, but are not limited to, an indicia scanner, a handheld scanner, a camera, and/or any other device that is capable of capturing a plurality of images of the indicia and/or generating indicia imaging data of the indicia. Additionally, or alternatively, the apparatus 200 may be in other form(s) and/or may comprise other component(s).

Figure 3:
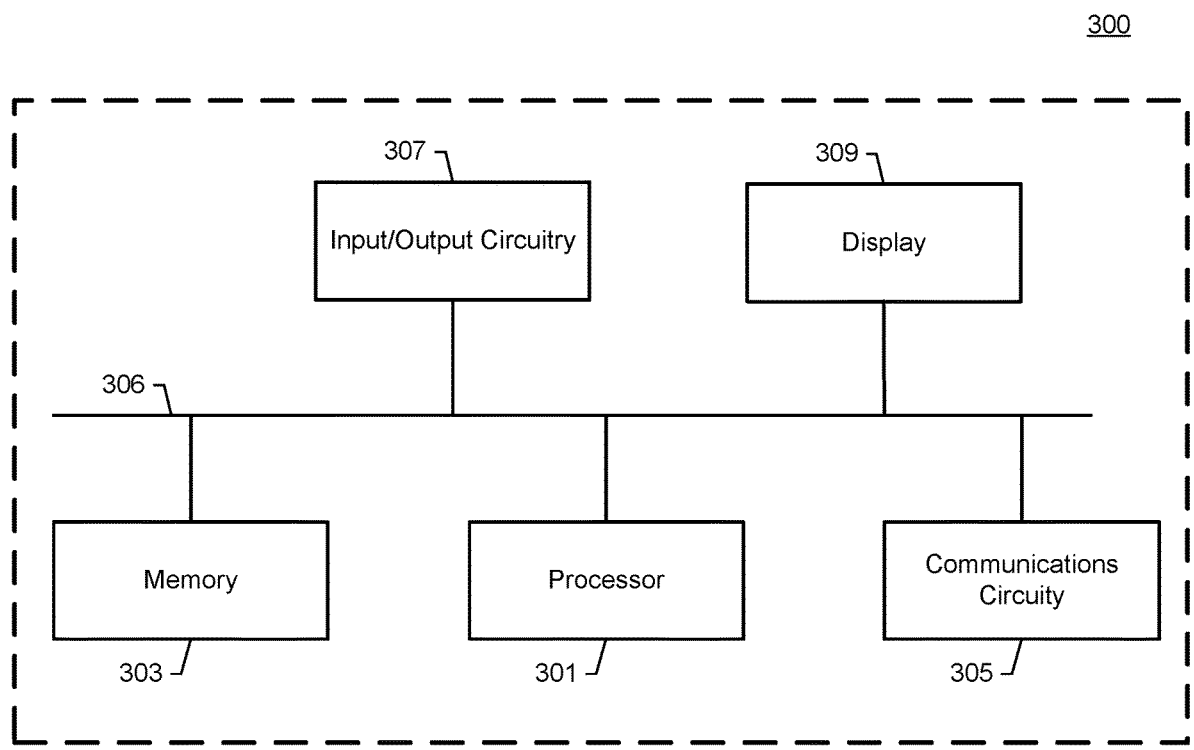
FIG. 3 illustrates an example block diagram of an example connected device in accordance with example embodiments described herein.

FIG. 3 illustrates an example block diagram of an example connected device in accordance with example embodiments described herein. The connected devices 120A-120N of FIG. 1 may include one or more computing systems, such as the apparatus 300 shown in FIG. 3. The apparatus 300 may include a processor 301, a memory 303, a communications circuitry 305, an input/output circuitry 307, and/or a display 309 that are in electronic communication with one another via a system bus 306. The apparatus 300 may be configured to execute the operations described herein. Although the components are described with respect to functional limitations, it should be understood that the particular implementations necessarily include the use of particular hardware. It should also be understood that certain of the components described herein may include similar or common hardware. For example, two sets of circuitries may both leverage use of the same processor, network interface, storage medium, or the like to perform their associated functions, such that duplicate hardware is not required for each set of circuitries.

In some embodiments, the processor 301 may be embodied in a number of different ways and may, for example, include one or more processing devices configured to perform independently. Additionally, or alternatively, the processor 301 may include one or more processors configured in tandem via a bus to enable independent execution of instructions, pipelining, and/or multithreading.

For example, the processor 301 may be embodied as one or more complex programmable logic devices (CPLDs), microprocessors, multi-core processors, co-processing entities, application-specific instruction-set processors (ASIPs), and/or controllers. Further, the processor 301 may be embodied as one or more other processing devices or circuitry. The term circuitry may refer to an entirely hardware embodiment or a combination of hardware and computer program products. Thus, the processor 301 may be embodied as integrated circuits, application specific integrated circuits (ASICs), field programmable gate arrays (FPGAs), programmable logic arrays (PLAs), hardware accelerators, another circuitry, and/or the like. As will therefore be understood, the processor 301 may be configured for a particular use or configured to execute instructions stored in volatile or non-volatile media or otherwise accessible to the processor 301. As such, whether configured by hardware or computer program products, or by a combination thereof, the processor 301 may be capable of performing steps or operations according to embodiments of the present disclosure when configured accordingly.

In some embodiments, the memory 303 may be non-transitory and may include, for example, one or more volatile and/or non-volatile memories. In other words, for example, the memory 303 may be an electronic storage device (e.g., a computer readable storage medium). The memory 303 may be configured to store information, data, content, applications, instructions, or the like, for enabling the apparatus 300 to carry out various functions in accordance with example embodiments of the present disclosure. In this regard, the memory 303 may be preconfigured to include computer-coded instructions (e.g., computer program code), and/or dynamically be configured to store such computer-coded instructions for execution by the processor 301.

In an example embodiment, the processor 301 may be configured to execute instructions stored in the memory 303 or otherwise accessible to the processor. Alternatively, or additionally, the processor 301 may be configured to execute hard-coded functionality. As such, whether configured by hardware or software methods, or by a combination thereof, the processor may represent an entity (e.g., physically embodied in circuitry) capable of performing operations according to an embodiment of the present disclosure while configured accordingly. Alternatively, as another example, when the processor 301 is embodied as an executor of software instructions, the instructions may specifically configure the processor to perform the algorithms and/or operations described herein when the instructions are executed.

In some embodiments, the apparatus 300 may include the input/output circuitry 307 that may, in turn, be in communication with the processor 301 to provide output to the user and, in some embodiments, to receive an indication of a user input. The input/output circuitry 307 may comprise an interface, a mobile application, a kiosk, or the like. In some embodiments, the input/output circuitry 307 may also include a keyboard, a mouse, a joystick, a touch screen, touch areas, soft keys, a microphone, a speaker, or other input/output mechanisms. The processor and/or user interface circuitry comprising the processor may be configured to control one or more functions of one or more user interface elements through computer program instructions (e.g., software and/or firmware) stored on a memory accessible to the processor (e.g., memory 303).

The communications circuitry 305 may be any means such as a device or circuitry embodied in either hardware or a combination of hardware and software that is configured to receive and/or transmit data from/to a network and/or any other device, circuitry, or module in communication with the apparatus 300. In this regard, the communications circuitry 305 may include, for example, a network interface for enabling communications with a wired or wireless communication network and/or in accordance with a variety of networking protocols described herein. For example, the communications circuitry 305 may include one or more network interface cards, antennae, buses, switches, routers, modems, and supporting hardware and/or software, or any other device suitable for enabling communications via a network. Additionally, or alternatively, the communication interface may include the circuitry for interacting with the antenna(s) to cause transmission of signals via the antenna(s) or to handle receipt of signals received via the antenna(s).

In some embodiments, the apparatus 300 may include a display 309 that may, in turn, be in communication with the processor 301 to display user interfaces (such as, but not limited to, display of indicia or decoded indicia). In various examples of the present disclosure, the display 309 may include a liquid crystal display (LCD), a light-emitting diode (LED) display, a plasma (PDP) display, a quantum dot (QLED) display, and/or the like.

Figure 4:
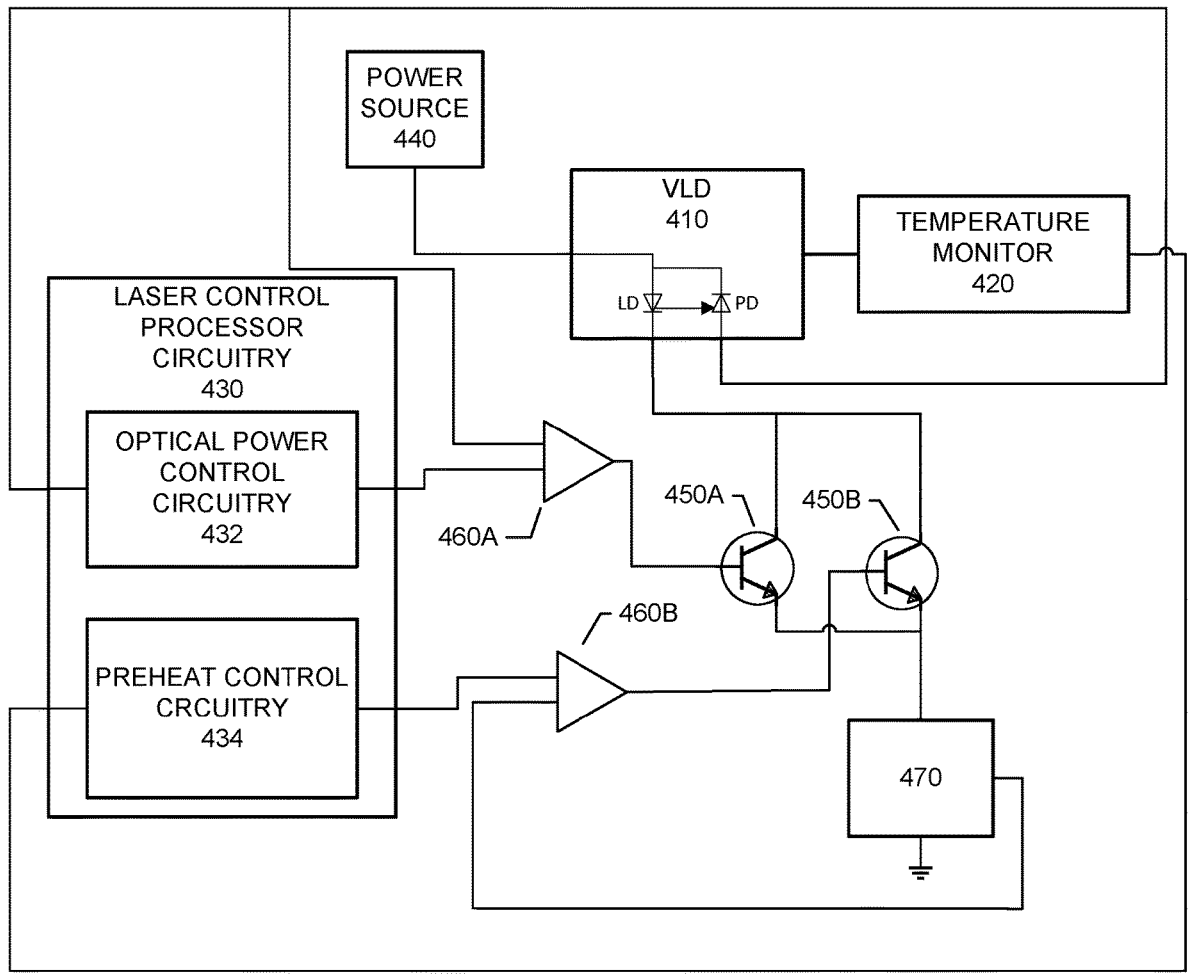
FIG. 4 illustrates an example circuit diagram for an indicia reader in accordance with example embodiments described herein.

FIG. 4 illustrates an example circuit diagram for an indicia reader in accordance with example embodiments described herein. The example circuit may include circuitry for optical power control as well as preheat control for a laser diode, which may be an aimer laser. The example circuit may include a laser diode, such as a visible light diode (VLD) 410, a temperature monitor 420, laser control processor circuitry 430, power source 440, one or more transistors 450A, 450B, one or more amplifiers 460A, 460B, and a current sensor component 470. Transistors 450A, 450B may be any type of transistors, including but not limited to BJTs.

In some embodiments, the visible light diode (VLD) 410 is an aimer laser and may be a green visible light diode. In alternative embodiments, VLD 410 may be a red visible light diode or may be another LED. A power source 440 may provide power input to the VLD 410. In some embodiments, the power source 440 may by a voltage source and the current VLD 410 may varied by controlling the impedance and/or resistance connected to the output of a light diode (LD) in the VLD 410, including but not limited to with circuitry described herein.

The VLD 410 may be in a package, and the VLD 410 package may include one or more light diodes (LD) as well as one or more photodiodes (PD). In some embodiments, VLD 410 may be an array of lasers. In some embodiments with an array of lasers, each laser of the array of lasers may be its own package. In some embodiments, the VLD 410 may include the laser diode anode connected to the photodiode cathode.

In some embodiments, control of an emitted laser beam from the VLD 410 may controlled with one or more circuitries. In some embodiments, the photodiode of the VLD 410 may provide a feedback signal that may be used to control the current level through the VLD 410, which may control the amount of light emitted by the VLD 410. The output of the photodiode may be an input into an amplifier 460A, which may be an error amplifier, and which the output of may be used to control a BJT 450A that is used to control the current in the VLD 410. The photodiode feedback signal may also be provided to optical power control circuitry 432, which may be part of a laser control processor circuitry 430. The optical control circuitry 432 may also be used to control the VLD 410 by providing an output that is input into amplifier 460A. The output of amplifier 460A may be used to control a BJT 450A, wherein the BJT 450A is used in conjunction with a current sensing component 470 to control the amount of current that may flow through VLD 410. In some embodiments, the current sensing component 470 may be a resistor. The optical control circuitry 432 may include algorithms or may execute operations to turn on or turn off the aimer laser for use with indicia reading by controlling output signals to work with BJT 450A to conduct current through the VLD 410.

In some embodiments, the preheating of the VLD 410 may be controlled with one or more circuitries. In some embodiments, a temperature monitor 420 may be utilized to measure a temperature of the VLD 410, such as at the LD junction or at a portion of the VLD 410 near the LD, such as on the circuit board. In some embodiments, the temperature monitor 420 may be a thermistor. In some embodiments, the temperature monitor 420 may include a thermistor and/or a processor, which may generate an output based on reading the thermistor, such as a digital output. The output of the temperature monitor 420 may be an analog or digital signal that may be input into a preheat control circuitry 434.

In some embodiments, preheat control circuitry 434 may be used to control a preheat current being applied to the VLD 410 by providing an output that is input into amplifier 460B. The amplifier 460B may also receive an input from the current sensor element 470. The output of amplifier 460B may be used to control a BJT 450B, wherein the BJT 450B is used in conjunction with the current sensing component 470 to control the amount of current that may flow through VLD 410. The current sensing component 470 may include circuitry that is the same as used with the optical power control circuitry 432 or may include additional or less circuitry for use with preheat control circuitry 434. For example, some embodiments of the current sensor element 470 may use one resistor associated with both the optical power control circuitry 432 and the preheat control circuitry 434. Alternatively, or additionally, the current sensor element 470 may include more than one resistor or circuit element for use with the optical power control circuitry 432 that is not used with the preheat control circuitry 434. Alternatively, or additionally, the current sensor element 470 may include more than one resistor or circuit element for use with the preheat control circuitry 434 that is not used with the optical power control circuitry 433. The impedance value of the current sensor element 470 may be determined based on a maximum gain of a BJT or on a maximum current that VLD 410 may be allowed to conduct. The preheat control circuitry 434 may include algorithms or may execute operations to turn on or turn off a preheat current for the VLD 410 by controlling output signals to work with BJT 450A to conduct current through the VLD 410.

The laser control processor circuitry 430 may include optical power circuitry 432 and preheat control circuitry 434. In some embodiments, the last control circuitry may be include processor 210 or processor 210 circuitry. In some embodiments, the laser control processor circuitry 430 may include one or more sub-processors, which may be in addition to processor 210.

In some embodiments, the output of the photodiode of VLD 410 as well as the output of the temperature monitor 420 may be used by the laser control processor circuitry 430 to monitor the health of the of the VLD 430. In some embodiments, if the temperature gets too high, such as above an operational temperature range, then the laser control processor circuitry 430 may control the VLD 410 to be turned off to lower the temperature. In some embodiments, the indicia reader 101 may track the temperature and/or photodiode output over time to determine if performance is being degraded, which may include adjusting the optical power control circuitry 432 to compensate for degradation in performance, which may include decreasing or increasing the amount of current to apply to VLD 410.

In some embodiments, the optical power control circuitry 432 and preheat control circuitry 434 may be controlled based on the operations of the other. In some embodiments, the preheat control circuitry 434 may only cause the application of a preheat current to the VLD 410 when the optical power control circuitry 432 is not causing the application of a current to turn on the aimer. The operation of the optical power control circuitry 432 may disable the preheat control circuitry 434. Alternatively, in some embodiments the operation of optical power control circuitry 434 may disable the operation of the optical power control circuitry 432.

Alternatively, in some embodiments the operation of preheat control circuitry 434 may operate in conjunction with the optical power control circuitry 432. The preheat control circuitry 434 may cause a preheat current to be applied to the VLD 410 and, after the VLD 410 is brought up to a desired temperature, the preheat control circuitry 434 may continue to apply a preheat current to the VLD 410 while the optical power control circuitry 432 may apply a current to cause the VLD 410 to lase a target.

In some embodiments, the temperature monitor 420 may also monitor the external environment for ambient temperature below a threshold (e.g., −10 C). When the temperature is below this threshold the preheat control circuitry 434 may apply a preheat current to the VLD 10 for a period of time. In some embodiments, the period of time may be 100 ms. The period of time may be known to increase the VLD 410 to a known temperature that is within the operational temperature range of the VLD 410. The preheat current and the time period may be determined during a calibration routine, which may vary the preheat current and the time period over different temperatures to determine varying values of preheat currents and periods of time, which may be stored in memory, such as in a table. These values may later be used by the preheat control circuitry 434 to apply a preheat current for a set period of time.

Additionally, or alternatively, in some embodiments the temperature monitor 420 may measure temperature by measuring a voltage drop detected across the VLD 410. Circuitry may apply a preheat current to the VLD 410 and measure the voltage at the input of the VLD 410 and out the output of the VLD 410. The preheat current may be applied when the voltage drop across VLD 410 is unknown, the temperature is unknown, or when the temperature is determined to be associated with a temperature outside of the operational temperature range. The temperature monitor 420 may convert the voltage drop amplitude into one or more signals indicative of a temperature. In this manner the voltage drop may be continued to be measured until it is measured to be a voltage drop associated with a temperature above a threshold above the lower limit of the operational temperature range.

In some embodiments, a first preheat current may be applied at a first time period before the VLD 410 may lase a target indicia 103. Subsequently, after the VLD 410 has reached an operational temperature range for a first time, a second preheat current may be applied after the VLD 410 has lased a target where the second preheat current is different from the first preheat current. The second preheat current may be applied after a time period has elapsed since the aimer lase a target indicia 103. This may keep the VLD 410 in the operational temperature range.

In some embodiments, the imaging component 202 may capture multiple images and a preheat current may be applied between image captures. In an embodiment, the imaging component 202 may capture 10 images, and an image capture may occur every 10 milliseconds with the image capture processing taking 1 millisecond. The preheat current may be applied between the image captures, such as for a period of 5 milliseconds.

In some embodiments, the indicia reader may include one or more motion sensors. The motion sensors may detect motion of the indicia reader 101, motion of the indicia 103, and or both. The detection of motion may be a trigger for the application of a preheat current. In some embodiments, the motion sensor may include, but is not limited to, one or more accelerometers, gyroscopes, and/or proximity sensors. The motion may correspond to the indicia reader 101 being aimed at an indicia 103. Alternatively, the motion may be associated with an indicia 103 moving into the field of view of the indicia reader 101. On detecting motion, the indicia reader 101 may apply a preheat current.

In some embodiments, the indicia reader 101 may include a sleep mode, a power saver mode, and/or a power off mode. On exiting the sleep mode, power saver mode, and/or power off mode, the indicia reader 101 may apply a preheat current to the VLD 410. This may allow the VLD 410 to reach a temperature in an operational temperature range and quickly be prepared for use. In various embodiments, the indicia reader 101 may be put into or taken out of a sleep mode, a power save mode, and/or a power off mode by a connected device 120. The application of the preheat current may be dependent on the temperature monitor sensing an temperature below the operational temperature range.

In some embodiments, when there is a trigger for capturing an image then the indicia reader 101 may apply a preheat current for a time period. The preheat control circuitry 434 may delay the application of a lasing current by coordinating or delaying current with the optical power control circuitry 432 for the time period. In some embodiments, the optical power control circuitry 432 would control BJT 450A to apply a lasing current, which may be through coordinating the control of BJT 450B with the preheat control circuitry 434. In some embodiments, BJT 450B may be controlled to stop conducting current before BJT 450A is controlled to conduct current. In some embodiments, alternatively, BJT 450A may be controlled to conduct current at the same time that BJT 450B is also conducting current, such that current is flowing through BJT 450A and BJT 450B in parallel. In such an embodiment, the preheat current may also serve as a bias current.

Figure 5:
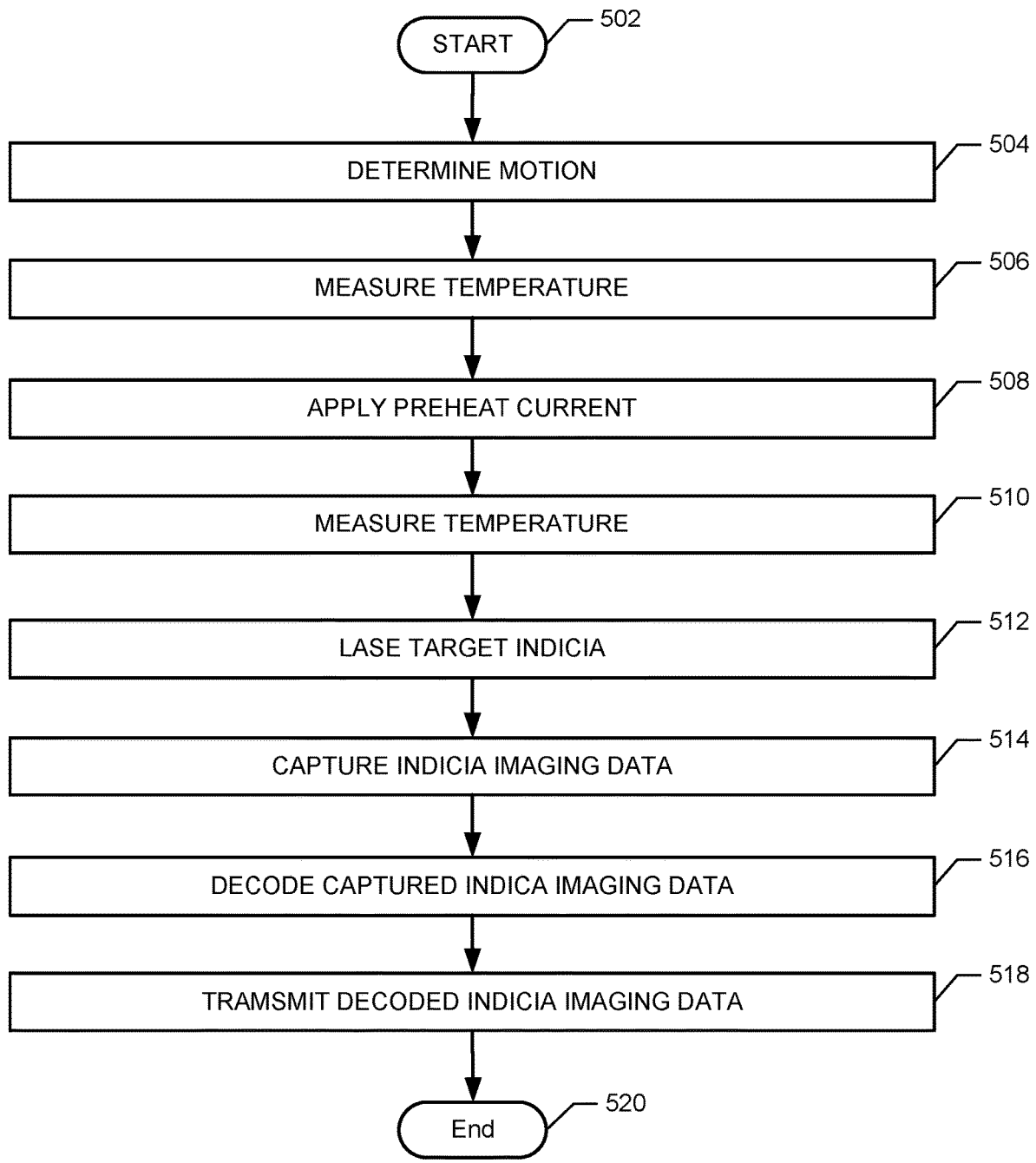
FIG. 5 illustrates an example process for an indicia reader in accordance with example embodiments described herein.

FIG. 5 illustrates an example process for an indicia reader in accordance with example embodiments described herein. The process of FIG. 5 may start at 502 and may end at 520. In some embodiments, one or more operations may be omitted. Additionally, other operations may be added to the process.

At operation 504, the indicia reader 101 determines motion. The motion may be determined by a motion sensor. In some embodiments, the motion will be motion of the indicia reader 101. In some embodiments, the motion may be motion of the indicia 103, such as the indicia entering into a field of view of the indicia reader. In some embodiments, the motion detected may be both motion of the indicia reader and motion of an indicia.

At operation 506, the indicia reader 101 may measure the temperature of a VLD 410, such as with temperature monitor 420 as described herein. If the temperature is below a first threshold than the indicia reader 101 may proceed to operation 508. If the temperature is above a first threshold then the indicia 101 may, depending on the embodiment, measure temperature periodically, continuously measure temperature, or proceed to operation 512.

At operation 508, the indicia reader 101 may apply a preheat current, which may be in response to measuring a temperature below a first threshold. In some embodiments, the first threshold may be a temperature at the low end of an operational temperature range. The application of a preheat current may be as described herein.

At operation 510, the indicia reader 101 may measure the temperature, which occurs while the preheat current is being or has been applied. Once the temperature rises above a first threshold, the indicia reader 101 may cause the preheat current to stopped being applied and the indicia reader 101 may proceed to operation 512.

At operation 512, the indicia reader 101 may lase a target indicia, such as with an aimer that uses VLD 410.

At operation 514, the indicia reader 101 may capture the indicia imaging data.

At operation 516, the indicia reader 101 may decode the captured indicia imaging data.

At operation 518, the indicia reader 101 may transmit the decoded indicia imaging data, such as to a connected device 120. In some embodiments, the indicia reader 101 may alternatively or additionally transmit the captured indicia imaging data in the transmission.

Figure 6:
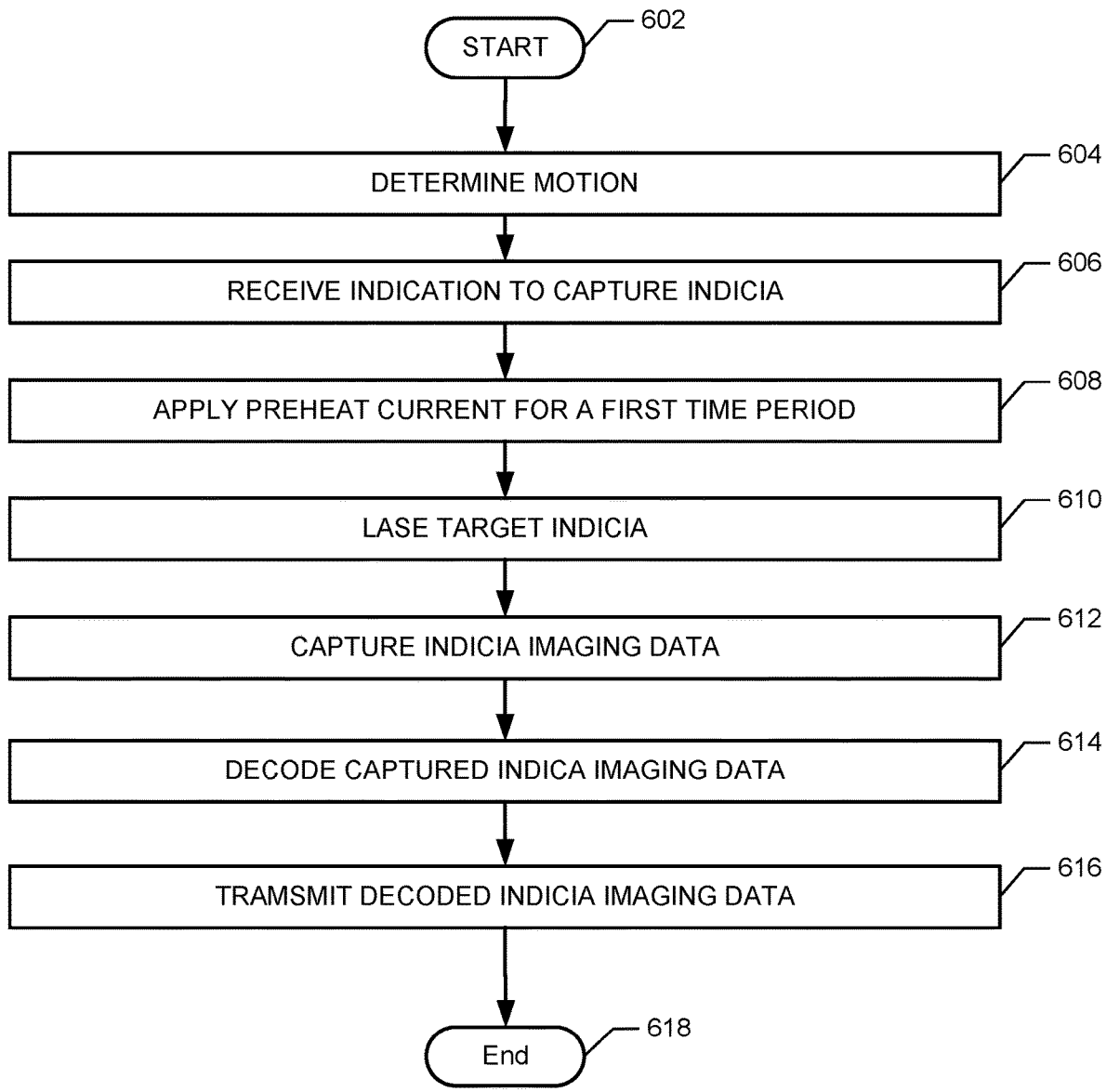
FIG. 6 illustrates an example process for an indicia reader in accordance with example embodiments described herein.

FIG. 6 illustrates an example process for an indicia reader in accordance with example embodiments described herein. The process of FIG. 6 may start at 602 and may end at 618. In some embodiments, one or more operations may be omitted. Additionally, other operations may be added to the process.

At operation 604, the indicia reader 101 determines motion. The motion may be determined by a motion sensor. In some embodiments, the motion will be motion of the indicia reader 101. In some embodiments, the motion may be motion of the indicia 103, such as the indicia entering into a field of view of the indicia reader. In some embodiments, the motion detected may be both motion of the indicia reader and motion of an indicia.

At operation 606, the indicia reader 101 may receive an indication to capture indicia 103. In some embodiment, an indication to capture indicia 103 may be from a trigger being pressed, such as with a handheld indicia reader 101. In some embodiment, an indication to capture indicia 103 may be from a determination made about the indicia by the indicia reader 101, such as recognizing a type of indicia 103. In some embodiments, an indication to capture indicia 103 may be received from a connected device 120, which may be in response to a user's operation of a connected device 120.

At operation 608, the indicia reader 101 may apply a preheat current for a first time period, which is described herein. In some embodiments, after the application of the preheat current is applied for a first time period the preheat current ceases to be applied and the indicia reader proceeds to operation 610.

At operation 610, the indicia reader 101 may lase a target indicia, such as with an aimer that uses VLD 410.

At operation 612, the indicia reader 101 may capture the indicia imaging data. In some embodiments, the capture of indicia imaging reader may be in response to receiving a second indication to capture indicia. In some embodiments, the second indication to capture indicia may be a second press of a trigger. In some embodiments, the second indication to capture indicia may be holding or continuous applying of a trigger. In some embodiments with a physical trigger on indicia reader 101, the second indication to capture indicia may be distinct from the indication to capture indicia at 606 by an amount or amplitude of a trigger, which may be for a physical trigger associated with fully depressing a trigger to indicate the second indication while the first indication may be a less than full depress (e.g., press halfway).

At operation 614, the indicia reader 101 may decode the captured indicia imaging data.

At operation 616, the indicia reader 101 may transmit the decoded indicia imaging data, such as to a connected device 120. In some embodiments, the indicia reader 101 may alternatively or additionally transmit the captured indicia imaging data in the transmission.

Although exemplary embodiments have been described above, implementations or embodiments of the subject matter and the operations described herein can be implemented in other types of digital electronic circuitry, computer software or program, firmware, or hardware, including the structures disclosed in this specification and their structural equivalents, or in combinations of one or more of them.

Embodiments of the subject matter described herein may be implemented as one or more computer programs, i.e., one or more modules of computer program instructions, encoded on computer storage medium for execution by, or to control the operation of, information/data processing apparatus. Alternatively, or in addition, the program instructions can be encoded on an artificially-generated propagated signal, e.g., a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The processes described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory or a random access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, e.g., magnetic, magneto-optical disks, or optical disks. However, a computer need not have such devices. Devices suitable for storing computer program instructions and information/data include all forms of non-volatile memory, media, and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

The term "data processing apparatus" as used above encompasses all kinds of apparatus, devices, and machines for processing data, including by way of example a programmable processor, a computer, a system on a chip, or multiple ones, or combinations, of the foregoing. The apparatus may include special purpose logic circuitry, e.g., an FPGA (field programmable gate array) or an ASIC (application-specific integrated circuit). The apparatus may also include, in addition to hardware, code that creates an execution environment for the computer program in question, e.g., code that constitutes processor firmware, a protocol stack, a repository management system, an operating system, a cross-platform runtime environment, a virtual machine, or a combination of one or more of them. The apparatus and execution environment may realize various different computing model infrastructures, such as web services, distributed computing, and grid computing infrastructures.

Computer software or computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A computer program can be stored in a portion of a file that holds other programs or information/data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

While this specification contains many specific implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. An indicia reader comprising:
an aimer laser;
a temperature monitor configured to determine an ambient temperature of an environment of the indicia reader;
a power source coupled to the aimer laser;
wherein, in an instance where the temperature monitor determines the ambient temperature is below a first temperature threshold associated with the environment, the power source is configured to apply a predetermined magnitude of a preheat current to the aimer laser for a first time period;
wherein the preheat current is continuously applied after an end of the first time period; and;
wherein the first time period and the predetermined magnitude of the preheat current are determined based on the ambient temperature determined.

2. The indicia reader of claim 1, wherein the preheat current is below a lasing threshold of the aimer laser.

3. The indicia reader of claim 1, wherein the preheat current is applied to the aimer laser until the temperature monitor determines a temperature of the aimer laser is above the first temperature threshold.

4. The indicia reader of claim 1, wherein the preheat current is applied to the aimer laser until the temperature monitor determines a temperature of the aimer laser is above a second temperature threshold, wherein the second temperature threshold is above the first temperature threshold.

5. The indicia reader of claim 1, wherein the aimer laser comprises a visible laser diode.

6. The indicia reader of claim 1, wherein the indicia reader further comprises a motion sensor, and wherein the temperature monitor is further configured to determine a temperature of the aimer laser on first determining motion.

7. The indicia reader of claim 6, wherein the determination of motion comprises motion of the indicia reader.

8. The indicia reader of claim 6, wherein the determination of motion comprises motion of an indicia.

* * * * *